US010903357B2

(12) United States Patent
Goktepeli et al.

(10) Patent No.: US 10,903,357 B2
(45) Date of Patent: Jan. 26, 2021

(54) LATERALLY DIFFUSED METAL OXIDE SEMICONDUCTOR (LDMOS) TRANSISTOR ON A SEMICONDUCTOR ON INSULATOR (SOI) LAYER WITH A BACKSIDE DEVICE

(71) Applicant: QUALCOMM Incorporated, San Diego, CA (US)

(72) Inventors: Sinan Goktepeli, San Diego, CA (US); George Pete Imthurn, San Diego, CA (US); Sivakumar Kumarasamy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/152,105

(22) Filed: Oct. 4, 2018

(65) Prior Publication Data
US 2019/0109232 A1    Apr. 11, 2019

Related U.S. Application Data

(60) Provisional application No. 62/659,319, filed on Apr. 18, 2018, provisional application No. 62/568,685, filed on Oct. 5, 2017.

(51) Int. Cl.
| | |
|---|---|
| *H01L 29/78* | (2006.01) |
| *H01L 29/66* | (2006.01) |
| *H01L 21/762* | (2006.01) |
| *H01L 29/40* | (2006.01) |
| *H01L 29/786* | (2006.01) |
| *H04B 1/00* | (2006.01) |
| *H04B 1/52* | (2015.01) |

(Continued)

(52) U.S. Cl.
CPC .... *H01L 29/7824* (2013.01); *H01L 21/76254* (2013.01); *H01L 21/76264* (2013.01); *H01L 27/1203* (2013.01); *H01L 29/402* (2013.01); *H01L 29/66681* (2013.01); *H01L 29/78603* (2013.01); *H01L 29/78624* (2013.01); *H01L 29/78648* (2013.01); *H04B 1/0064* (2013.01); *H04B 1/52* (2013.01); *H04B 1/38* (2013.01)

(58) Field of Classification Search
None
See application file for complete search history.

(56) References Cited

U.S. PATENT DOCUMENTS

| 9,755,029 B1 | 9/2017 | Goktepeli et al. |
| 2006/0049406 A1 | 3/2006 | Amaratunga et al. |

(Continued)

OTHER PUBLICATIONS

International Search Report and Written Opinion—PCT/US2018/054538—ISA/EPO—dated Jan. 7, 2019.

*Primary Examiner* — Zandra V Smith
*Assistant Examiner* — Lawrence C Tynes, Jr.
(74) *Attorney, Agent, or Firm* — Seyfarth Shaw LLP

(57) ABSTRACT

An integrated circuit is described. The integrated circuit includes a laterally diffused metal oxide semiconductor (LDMOS) transistor. The LDMOS is on a first surface of an insulator layer of the integrated circuit. The LDMOS transistor includes a source region, a drain region, and a gate. The LDMOS transistor also includes a secondary well between the drain region and the gate. The secondary well has an opposite polarity from the drain region. The LDMOS transistor further includes a backside device on a second surface opposite the first surface of the insulator layer.

12 Claims, 11 Drawing Sheets

(51) Int. Cl.
*H01L 27/12* (2006.01)
*H04B 1/38* (2015.01)

(56) References Cited

U.S. PATENT DOCUMENTS

| | | | | |
|---|---|---|---|---|
| 2013/0214866 A1* | 8/2013 | He | ............................ | H03F 3/211 |
| | | | | 330/295 |
| 2014/0367777 A1* | 12/2014 | Huang | .............. | H01L 21/76877 |
| | | | | 257/337 |
| 2016/0379936 A1* | 12/2016 | Spitzlsperger | .... | H01L 29/41708 |
| | | | | 257/139 |
| 2017/0301780 A1* | 10/2017 | Boles | .................... | H01L 29/401 |
| 2018/0269877 A1* | 9/2018 | Stroud | ................... | H03K 3/011 |

\* cited by examiner

US 10,903,357 B2

LATERALLY DIFFUSED METAL OXIDE SEMICONDUCTOR (LDMOS) TRANSISTOR ON A SEMICONDUCTOR ON INSULATOR (SOI) LAYER WITH A BACKSIDE DEVICE

CROSS-REFERENCE TO RELATED APPLICATIONS

The present application claims the benefit of U.S. Provisional Patent Application No. 62/659,319, filed Apr. 18, 2018, and titled "LATERALLY DIFFUSED METAL OXIDE SEMICONDUCTOR (LDMOS) TRANSISTOR ON A SEMICONDUCTOR ON INSULATOR (SOI) LAYER WITH A BACKSIDE DEVICE" and U.S. Provisional Patent Application No. 62/568,685, filed Oct. 5, 2017, and titled "LATERALLY DIFFUSED METAL OXIDE SEMICONDUCTOR (LDMOS) TRANSISTOR ON A SEMICONDUCTOR ON INSULATOR (SOI) LAYER WITH A BACKSIDE FIELD PLATE," the disclosures of which are expressly incorporated by reference herein in their entireties.

TECHNICAL FIELD

The present disclosure generally relates to integrated circuits (ICs). More specifically, the present disclosure relates to a laterally diffused metal oxide semiconductor (LDMOS) device on a semiconductor on insulator (SOI) layer with a backside device.

BACKGROUND

The design complexity of mobile radio frequency (RF) chips (e.g., mobile RF transceivers) is complicated by added circuit functions to support communications enhancements. Designing mobile RF transceivers may include using semiconductor on insulator technology. Semiconductor on insulator (SOI) technology replaces conventional semiconductor (e.g., silicon) substrates (e.g., wafers) with a layered semiconductor-insulator-semiconductor substrate for reducing parasitic device capacitance and improving performance.

SOI-based devices differ from conventional, silicon-built devices because a silicon junction is above an electrical isolator, typically a buried oxide (BOX) layer. A reduced thickness of the BOX layer, however, may not sufficiently reduce the parasitic capacitance caused by the proximity of an active device on the semiconductor layer and a semiconductor substrate supporting the BOX layer. The active devices on the SOI layer may include complementary metal oxide semiconductor (CMOS) transistors.

A high voltage power amplifier and a high voltage switch may use a type of CMOS transistor referred to as a laterally diffused metal oxide semiconductor device (LDMOS). LDMOS transistors represent a type of an asymmetric power metal oxide semiconductor field effect transistor (MOSFET). LDMOS transistors are generally designed to achieve a low on-resistance and a high blocking voltage. These features may be supported by creating a diffused P-type channel region in a low-doped N-type drain region. LDMOS transistors fabricated on SOI substrates, however, suffer from reliability issues that prevent achieving the full performance potential offered by SOI technology.

SUMMARY

An integrated circuit is described. The integrated circuit includes a laterally diffused metal oxide semiconductor (LDMOS) transistor. The LDMOS is on a first surface of an insulator layer of the integrated circuit. The LDMOS transistor includes a source region, a drain region, and a gate. The LDMOS transistor also includes a secondary well between the drain region and the gate. The secondary well has an opposite polarity from the drain region. The LDMOS transistor further includes a backside device on a second surface opposite the first surface of the insulator layer.

A method of constructing an integrated circuit is described. The method includes fabricating a laterally diffused metal oxide semiconductor (LDMOS) transistor. The LDMOS transistor is fabricated on a first surface of an insulator layer supported by a sacrificial substrate. The method also includes depositing a front-side dielectric layer on the LDMOS transistor. The method further includes bonding a handle substrate to the front-side dielectric layer. The method also includes removing the sacrificial substrate. The method further includes fabricating a backside device on a second surface opposite the first surface of the insulator layer.

An integrated circuit is described. The integrated circuit includes a laterally diffused metal oxide semiconductor (LDMOS) transistor. The LDMOS is on a first surface of an insulator layer. The LDMOS transistor includes a source region, a drain region, and a gate. The LDMOS transistor also includes a secondary well between the drain region and the gate. The secondary well has an opposite polarity from the drain region. The integrated circuit also includes means for biasing a backside of the secondary well of the LDMOS transistor.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
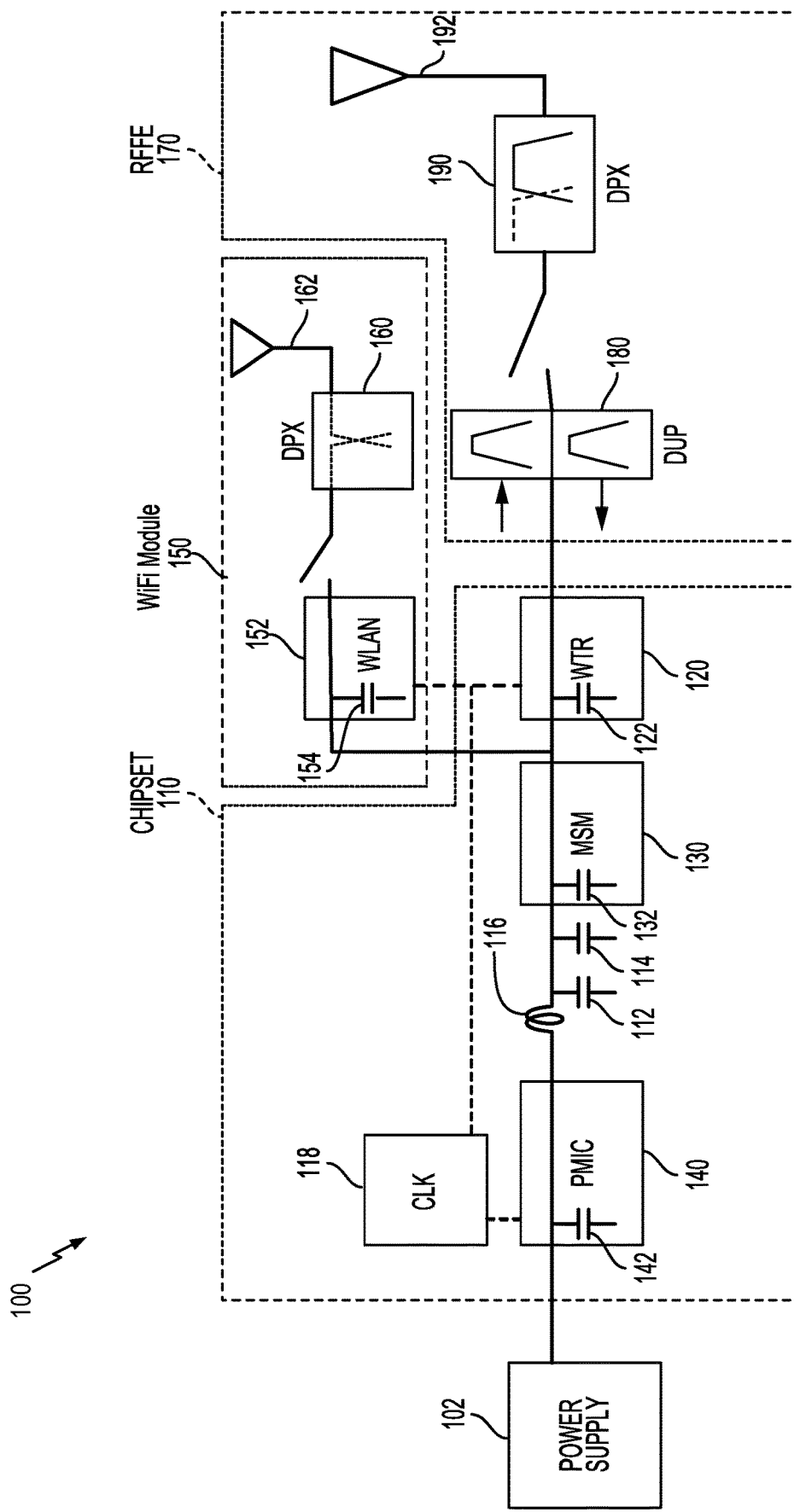
FIG. 1 is a schematic diagram of a wireless device having a wireless local area network module and a radio frequency (RF) front-end module for a chipset.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Designing mobile radio frequency (RF) chips (e.g., mobile RF transceivers) is complicated by adding circuit functions for supporting new communications enhancements. Semiconductor on insulator technology may be used for designing mobile RF transceivers. Semiconductor on insulator (SOI) technology replaces conventional silicon substrates with a layered semiconductor-insulator-semiconductor substrate. An SOI substrate beneficially reduces parasitic device capacitance, while improving mobile RF transceiver performance.

SOI-based devices differ from conventional, silicon-built devices. For example, in SOI-based devices, a silicon junction is above an electrical isolator, typically a buried oxide (BOX) layer. In operation, a thickness of the BOX layer determines a distance between the active devices in an SOI substrate. A sufficient distance between the active device and the SOI substrate is important for improving active device performance. Reducing device footprints for meeting specifications of future process nodes, however, reduces a thickness of the BOX layer as well as a distance between the active device and the SOI substrate. Reducing the thickness of the BOX layer in future process nodes may significantly reduce device performance. That is, device performance is degraded by increasing a proximity of the active device and the SOI substrate in future process nodes.

A mobile RF transceiver may include circuits for amplifying communications signals. The amplifier circuits may include amplifier stages having driver stages and amplifier output stages. Each of the amplifier stages includes one or more transistors configured in various ways to amplify the communications signals. Various options exist for fabricating the transistors for amplifying the communications signals transmitted and received by mobile RF transceivers. These transistors may be fabricated on an SOI substrate as complementary metal oxide semiconductor (CMOS) transistors. Similarly, high performance CMOS RF switch technologies are currently manufactured using SOI substrates. Unfortunately, successful fabrication of CMOS transistors using SOI technology is complicated by parasitic capacitance.

RF power amplifiers and high voltage switching applications may use a type of CMOS transistor referred to as a laterally diffused metal oxide semiconductor (LDMOS) transistor. LDMOS transistors represent a type of an asymmetric power metal oxide semiconductor field effect transistor (MOSFET). LDMOS transistors are generally designed to achieve a low on-resistance and a high blocking voltage. These features may be supported by creating a diffused P-type channel region in a low-doped N-type drain region. LDMOS transistors fabricated on SOI substrates, however, suffer from reliability issues that prevent achieving a full performance potential offered by SOI technology.

Various aspects of the present disclosure provide techniques for fabricating an LDMOS transistor on a semiconductor on insulator (SOI) layer with a backside device. The process flow for semiconductor fabrication of the LDMOS transistor may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms "chip" and "die" may be used interchangeably.

A MOSFET is generally configured as a three terminal device, with the terminals commonly identified as a gate, a source region, and a drain region. For example, a gate voltage may control current flowing from the drain region to the source region of the MOSFET. In operation, the gate induces a field-enhanced depletion region between the source and drain regions for creating a "channel." An LDMOS channel is predominantly defined by a physical size of the gate structure as well as the implantation and diffusion area. The source and drain regions are generally on laterally opposing sides of a gate area.

An LDMOS channel current is controlled by a vertical electric field induced by the gate and a lateral field that exists between the source and drain. That is, an LDMOS transistor generally operates based on a lateral surface-effect due to a drift region between a body and a drain of the LDMOS structure. This LDMOS structure provides performance advantages over other MOSFET structures. For example, state of the art silicon planar processes can fabricate transistors, using an LDMOS structure, that achieve breakdown voltages similar to large bandgap semiconductors. In particular, implementing LDMOS transistors in mobile RF transceivers is possible due to silicon integration of RF power amplifiers and high voltage RF switching applications.

The LDMOS structure has some limitations. For example, a depletion region of an LDMOS device may extend into the channel region, reducing an actual channel length formed by diffusion to an effective channel length. Undesired behavior, such as hot carrier injection due to the high electric fields, drain induced barrier lowering (DIBL), and short channel effects (SCE) may be caused by an extended diffusion region. In particular, one primary limitation of LDMOS devices is charging of a gate oxide due to hot carrier effects. For example, a device having a breakdown of 20 volts (V) generally supports reliable operation up to 12 V.

In practice, hot carrier effects in LDMOS devices can be mitigated by complex processes where multiple implants are performed. The effect of multiple implants is to ensure that a drift region of an LDMOS transistor is depleted of charge when a drain-to-source voltage ($V_{DS}$) is high. For example, multiple implants may be performed for substantially increasing a breakdown voltage, while reducing an electric field in the gate oxide.

SOI technology may provide some benefits for LDMOS transistors. For example, in SOI technology, low amounts of charge are specified for switching a transistor from on to off. SOI technology also provides high device isolation. Unfortunately, thin films of silicon used in SOI technology do not lend themselves to the multiple implant process used in LDMOS transistors for mitigating hot carrier effects. That is, SOI technology is generally not used to fabricate LDMOS transistors due to reliability concerns. As a result, LDMOS transistors fail to capture the full performance potential offered by SOI technology.

A field plate is a conductive layer that is connected to the gate and placed above the drift region to control an electric field in the drift region of an LDMOS device. Placing a field plate above the drift region may be performed for reducing a peak electric field in the LDMOS device. Reducing the peak electric field in the LDMOS device improves device performance. In addition, using a field plate in an LDMOS device may help mitigate hot carrier effects. Unfortunately, using a field plate adds processing complexity and increases an undesirable gate-to-drain parasitic capacitance in LDMOS devices.

A gate shield is another structure that is used to reduce the peak electric field in the drift region of an LDMOS device. A gate shield may appear similar to a field plate, but a gate shield is connected to the source region instead of the gate. Nevertheless, parasitic capacitance may be caused by a proximity between the gate shield/field plate and the transistor gates. While a field plate increases gate-to-drain capacitance, a gate shield increases drain-to-source capacitance. Drain-to-source capacitance, however, is not as undesirable as increased gate-to-drain capacitance. While a gate shield adds considerable processing complexity and processing steps, using gate shields is desirable for high performance LDMOS devices.

Layer transfer technology offers a unique opportunity to address some of the reliability problems incurred when fabricating LDMOS devices on SOI wafers. Using layer transfer technology enables an LDMOS device to realize the full performance potential of SOI technology. According to aspects of the present disclosure, layer transfer technology is used for forming a backside device (e.g., a backside field plate (BFP)). As described herein, the term "field plate" may refer to a backside electrode connected to a gate, a source region, or biased independently of both the gate and the source region. If a backside field plate is connected to the gate, it is essentially acting as a field plate, but with considerably reduced gate-to-drain capacitance because it is not in proximity to a drain metal.

According to aspects of the present disclosure, a backside device (e.g., a field plate) may serve as a second gate when formed by depositing a thin backside oxide on a backside surface of an insulator (e.g., BOX) layer. When the gate is turned off, the backside device is also at a same voltage for inhibiting charge carrier movement into a drift region. Inhibiting charge carrier movement into the drift region beneficially leads to a higher breakdown voltage of the LDMOS device. Furthermore, performing a retrograde implant in the drift region, in combination with a backside device, may create a conduction channel when the LDMOS device is turned on.

In one configuration, a backside device (e.g., field plate) is positioned for directing movement of charge to a backside interface between the backside device and an insulator layer. For example, the backside device may be positively biased for adjusting an electric field in the drift region of an LDMOS device. That is, the backside device may control internal electron distribution by adjusting a bias in the backside device, such as a field plate. Controlling the charge movement reduces exposure of the gate oxide to hot carrier injection, which prevents gate oxide damage. If the backside device is biased separately from other electrodes, higher voltages can be used for enhancing desired effects. These desired effects may include a lower on-resistance (Ron) as well as a higher off-breakdown voltage.

In different configurations, the backside device is connected to the gate or the source region of the LDMOS device. Alternatively, the backside device may be separately biased. In addition, the backside device may be used effectively on N-type or P-type field effect transistors (FETs). Placement of an edge of the backside device on a gate side may be selectively varied for improving an on-resistance and/or reducing parasitic capacitance. A location of the edge of the backside device on a drain side may also be selectively varied for improving the breakdown voltage and/or reducing the parasitic capacitance. The length of the drift region may also be varied. The doping concentration in the drift region may be varied. The gate length may also be varied. A semiconductor (e.g., silicon) layer thickness may also be varied. A body tie for removing excess charge from the body may be beneficial to operating the LDMOS device. A backside oxide thickness, a gate oxide thickness, and/or a channel doping may also be varied.

FIG. 1 is a schematic diagram of a wireless device 100 (e.g., a cellular phone or a smartphone) including an LDMOS. The wireless device 100 has a wireless local area network (WLAN) (e.g., WiFi) module 150 and an RF front-end module 170 for a chipset 110. The WiFi module 150 includes a first diplexer 160 communicably coupling an antenna 162 to a wireless local area network module (e.g., WLAN module 152). The RF front-end module 170 includes a second diplexer 190 communicably coupling an antenna 192 to the wireless transceiver 120 (WTR) through a duplexer 180 (DUP). The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device 100 generally includes a mobile RF transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section may obtain a received RF signal via the antenna 192 and may amplify the received RF signal using a low noise amplifier (LNA) and process the received RF signal to recover data sent by the base station in a communications signal.

The wireless transceiver 120 may include one or more circuits for amplifying these communications signals. The amplifier circuits (e.g., LNA/PA) may include one or more amplifier stages that may have one or more driver stages and one or more amplifier output stages. Each of the amplifier stages includes one or more transistors configured in various ways to amplify the communications signals. Various options exist for fabricating the transistors that are configured to amplify the communications signals transmitted and received by the wireless transceiver 120.

In FIG. 1, the wireless transceiver 120 and the RF front-end module 170 may be implemented using semiconductor on insulator (SOI) technology for fabricating transistors of the wireless transceiver 120 and the RF front-end module 170, which helps reduce high order harmonics in the RF front-end module 170. SOI technology replaces conventional semiconductor substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. A reduced thickness of the BOX layer in sub-micron process nodes, however, may not sufficiently reduce the parasitic capacitance caused by the proximity of an active device on the semiconductor layer and a semiconductor substrate supporting the BOX layer. As a result, a layer transfer process is introduced to further separate the active device from the substrate, as shown in FIGS. 2A to 2D.

Figure 2A:
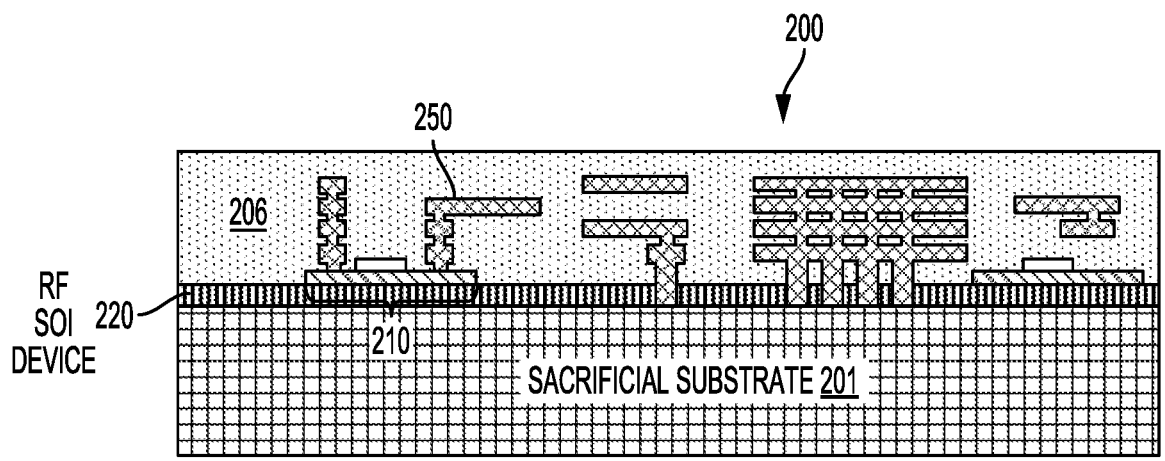
FIGS. 2A to 2D show cross-sectional views of a radio frequency (RF) integrated circuit during a layer transfer process according to aspects of the present disclosure.
Figure 2B:
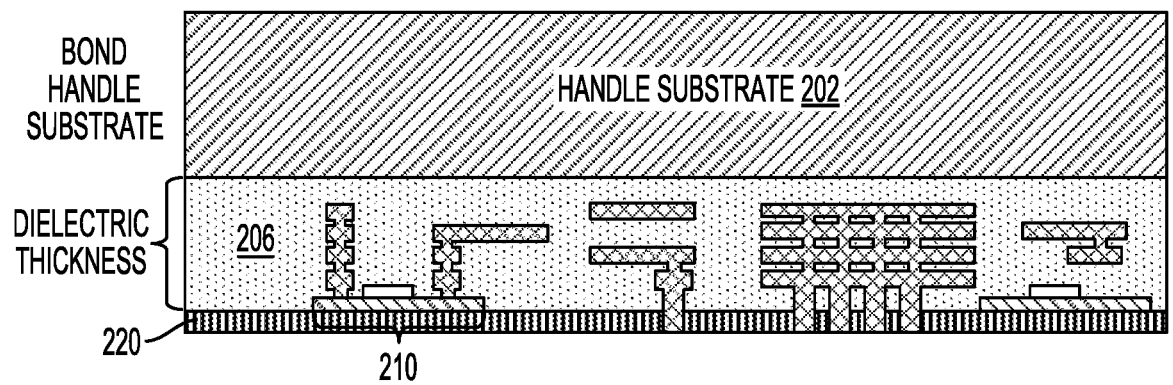

FIGS. 2A to 2D show cross-sectional views of a radio frequency (RF) integrated circuit 200 during a layer transfer process according to aspects of the present disclosure. As shown in FIG. 2A, an RF silicon on insulator (SOI) device includes an active device 210 on a buried oxide (BOX) layer 220 supported by a sacrificial substrate 201 (e.g., a bulk wafer). The RF SOI device also includes interconnects 250 coupled to the active device 210 within a first dielectric layer 206. As shown in FIG. 2B, a handle substrate 202 is bonded to the first dielectric layer 206 of the RF SOI device. In addition, the sacrificial substrate 201 is removed. Removal of the sacrificial substrate 201 using the layer transfer process enables high-performance, low-parasitic RF devices by increasing the dielectric thickness. That is, a parasitic capacitance of the RF SOI device is proportional to the dielectric thickness, which determines the distance between the active device 210 and the handle substrate 202.

Figure 2C:
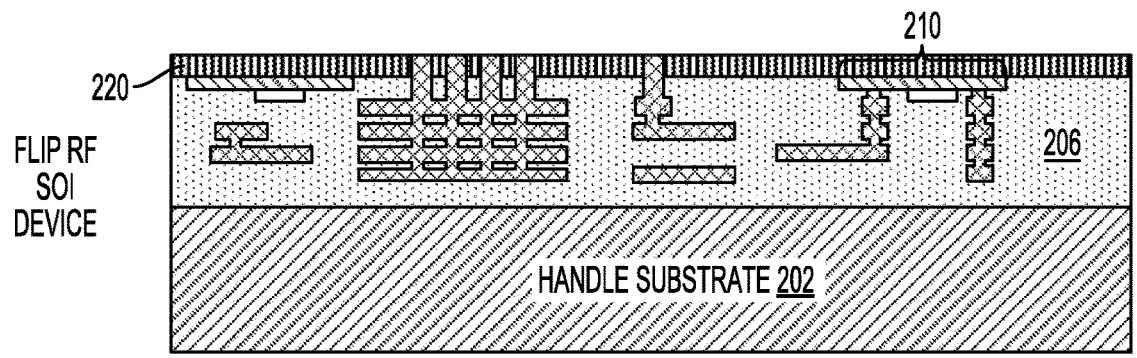
Figure 2D:
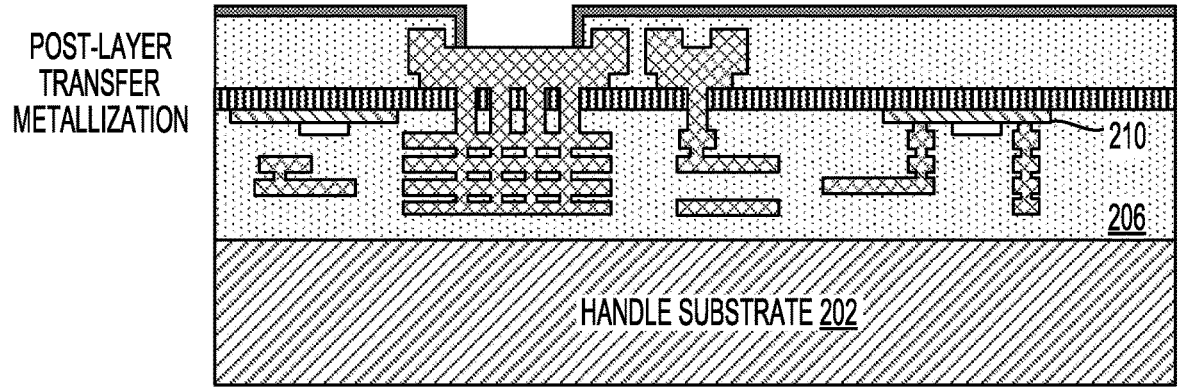

As shown in FIG. 2C, the RF SOI device is flipped once the handle substrate 202 is secured and the sacrificial substrate 201 is removed. As shown in FIG. 2D, a post layer transfer metallization process is performed using, for example, a regular complementary metal oxide semiconductor (CMOS) process.

The active device 210 on the BOX layer 220 may be a complementary metal oxide semiconductor (CMOS) transistor. The wireless transceiver 120 of FIG. 1 may include RF power amplifiers and high voltage switching applications that use an LDMOS transistor.

Figure 3:
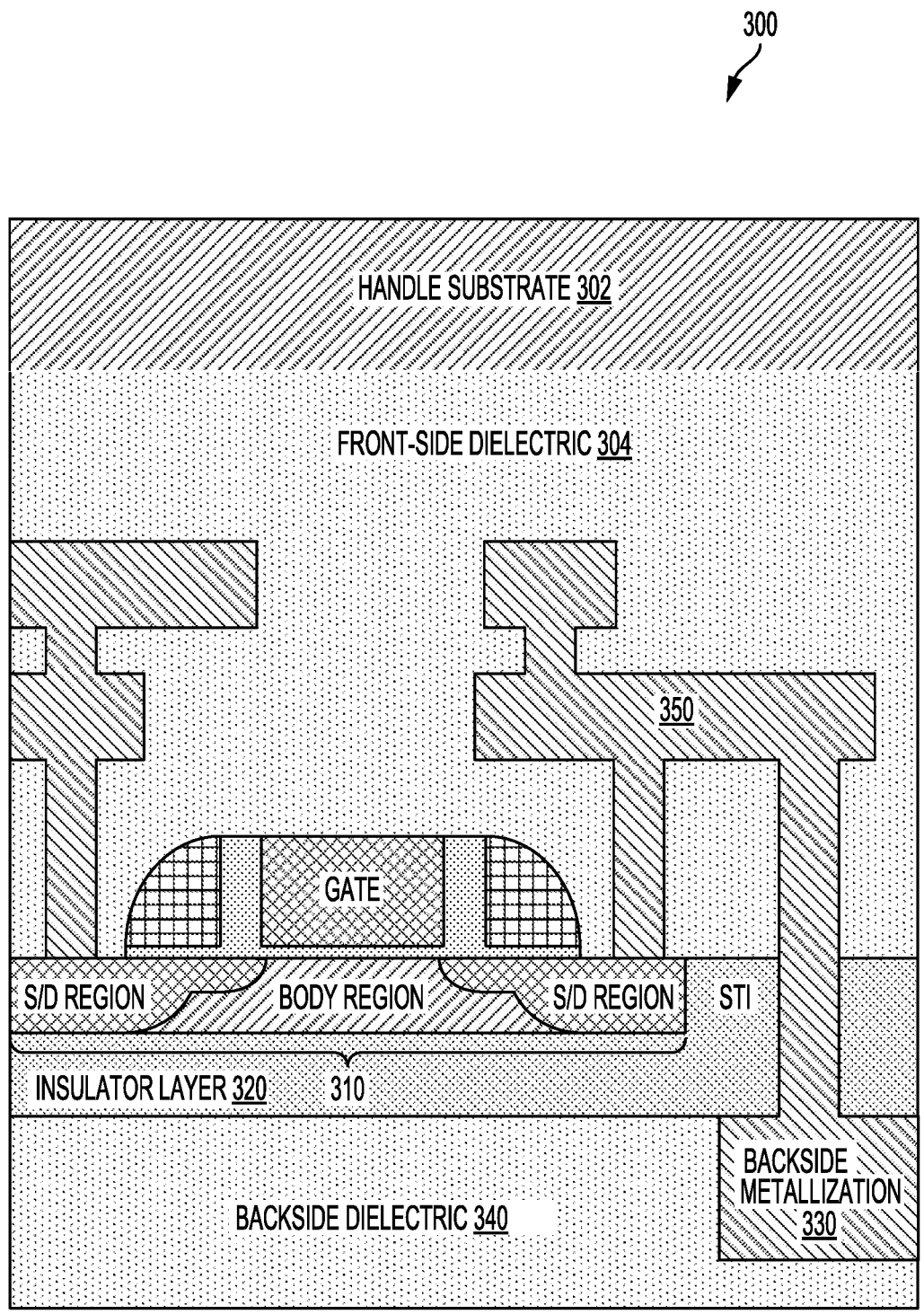
FIG. 3 is a cross-sectional view of a radio frequency (RF) integrated circuit fabricated using a layer transfer process.

FIG. 3 is a cross-sectional view of an RF integrated circuit 300 fabricated using a layer transfer process. Representatively, the RF integrated circuit 300 includes an active device 310 having a gate, a body, and source/drain (S/D) regions formed on an insulator layer 320. In SOI implementations, the insulator layer 320 is a buried oxide (BOX) layer, and the body and source/drain regions are formed from an SOI layer (e.g., silicon) including shallow trench isolation (STI) regions supported by the insulator layer 320. A body contact may be tied to the source region of the active device 310. Alternatively, the active device 310 may be configured as a four terminal device according to a body-in-source (BIS) configuration.

The RF integrated circuit 300 also includes middle-of-line (MOL)/back-end-of-line (BEOL) interconnects coupled to the source/drain regions of the active device 310. As described herein, the MOL/BEOL layers are referred to as front-side layers. By contrast, the layers supporting the insulator layer 320 may be referred to herein as backside layers. According to this nomenclature, a front-side metallization 350 is coupled to the source/drain regions of the active device 310 and arranged in a front-side dielectric layer 304. In addition, a handle substrate 302 is coupled to the front-side dielectric layer 304. In this example, a backside dielectric 340 is adjacent to and possibly supports the insulator layer 320. A backside metallization 330 is coupled to the front-side metallization 350. The front-side metallization 350 may be a front-side back-end-of-line (BEOL) interconnect and the backside metallization 330 may be a backside back-end-of-line (BEOL) interconnect. According to aspects of the present disclosure, the active device 310 may be fabricated as an LDMOS structure, for example, as shown in FIGS. 4A to 5B.

Figure 4A:
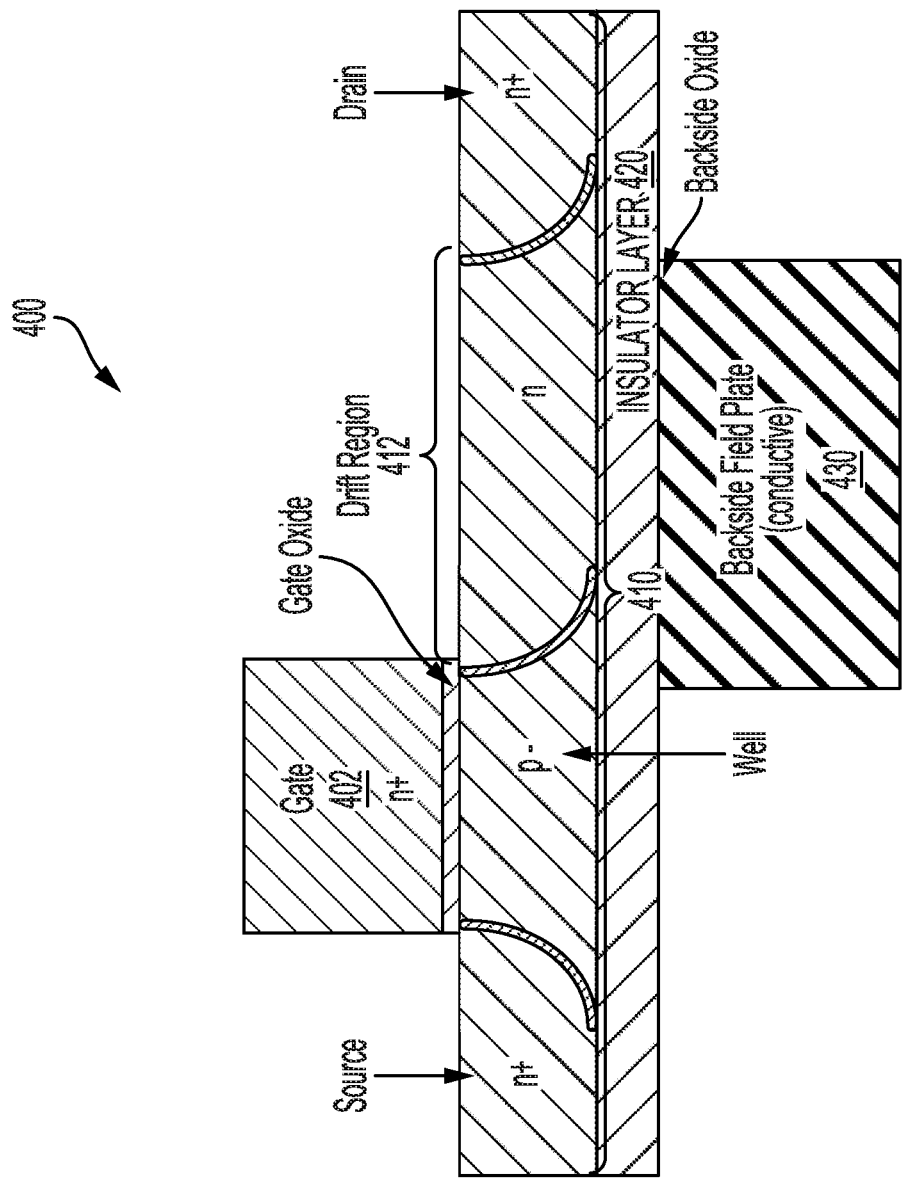
FIG. 4A is a cross-sectional view of an N-type semiconductor device on a semiconductor on insulator (SOI) layer with a backside field plate fabricated using a layer transfer process, according to aspects of the present disclosure.

FIG. 4A is a cross-sectional view of an integrated circuit, including an N-type semiconductor device (e.g., a laterally diffused metal oxide semiconductor (LDMOS) transistor) on a semiconductor on insulator (SOI) layer with a backside field plate fabricated using a layer transfer process, according to aspects of the present disclosure. Layer transfer technology offers a unique opportunity to address reliability problems that arise when fabricating LDMOS devices on SOI wafers. Layer transfer technology enables an LDMOS device to realize the full performance potential of SOI technology.

Representatively, an RF integrated circuit 400 includes an active device 410 having a gate 402, a body (e.g., well), a gate oxide between the well and the gate 402, a source region, and a drain region formed on an insulator layer 420. In SOI implementations, the insulator layer 420 is a buried oxide (BOX) layer, and the well and the source/drain regions are formed from an SOI layer (e.g., a silicon layer) supported by the insulator layer 420. In this configuration, the active device 410 is an LDMOS transistor, as noted by a drift region 412 between the well and the drain of the active device 410. The LDMOS transistor is shown in an N-type field effect transistor (NFET) configuration, although other configurations are possible.

LDMOS transistors represent a type of an asymmetric power metal oxide semiconductor field effect transistor (MOSFET). In operation, an LDMOS channel current is controlled by a vertical electric field induced by the gate and a lateral field that exists between the source and drain. That is, an LDMOS transistor generally operates based on a lateral surface-effect due to the drift region (e.g., 412) of LDMOS structures. LDMOS transistors fabricated on SOI substrates, however, suffer from reliability issues that prevent achieving the full performance potential offered by SOI technology. For example, undesired behavior includes hot carrier injection due to the high electric fields, drain induced barrier lowering (DIBL), and short channel effects (SCE). The undesired behaviors may be caused by an extended diffusion region (e.g., drift region 412) in LDMOS structures.

A field plate is a conductive layer that is conventionally connected to the gate and placed above the drift region to control an electric field in the drift region (e.g., 412) of an LDMOS device (e.g., 410). Placing a field plate above the drift region may reduce a peak electric field in the LDMOS device. Reducing the peak electric field in the LDMOS device improves device performance. In addition, using a field plate in an LDMOS device may help mitigate hot carrier effects. Unfortunately, using a field plate adds processing complexity and increases an undesired gate-to-drain parasitic capacitance in LDMOS devices.

A gate shield is another structure that is conventionally used to reduce the peak electric field in the drift region of an LDMOS device. A gate shield may appear similar to a field plate, but a gate shield is connected to the source region instead of the gate in the LDMOS device. Nevertheless, parasitic capacitance may be caused by a proximity between the gate shield/field plate and the transistor gates. While a field plate increases gate-to-drain capacitance, a gate shield increases drain-to-source capacitance. Drain-to-source capacitance, however, is preferable to increased gate-to-drain capacitance. While a gate shield adds considerable processing complexity and processing steps, gate shields are desirable for high performance LDMOS devices.

The layer transfer shown in FIGS. 2A-2D offers a unique opportunity to address some of the reliability problems incurred when fabricating LDMOS devices on SOI wafers for realizing the full performance potential of SOI technology. According to aspects of the present disclosure, layer transfer technology is used for forming a backside device, such as a backside field plate (BFP). As described, the term "field plate" may refer to a backside electrode connected to the gate, source, or biased independently of both. If a backside field plate is connected to the gate, it is essentially acting as a field plate, but with considerably reduced gate-to-drain capacitance because it is not in proximity to a drain metal.

For example, as shown in FIG. 4A, a backside field plate 430 is formed on a second surface opposite a first surface of the insulator layer 420. The backside field plate 430 may be formed by depositing a layer of a conductive material (e.g., copper) on the second surface of the insulator layer 420. A length of the backside field plate 430 may be in the range of 0.5 to 1.5 microns. In addition, a thickness of the backside field plate 430 may be approximately 270 nanometers.

According to aspects of the present disclosure, the backside field plate 430 may serve as a second gate when formed by depositing a thin backside oxide on the second surface of the insulator layer 420. When the gate 402 is turned off, the backside field plate 430 is also at the same off-voltage for inhibiting charge carrier movement into the drift region 412. Inhibiting charge carrier movement into the drift region 412 beneficially leads to a higher breakdown voltage of the active device 410. Furthermore, performing a retrograde implant in the drift region 412, in combination with the backside field plate 430, may create a conduction channel when the active device 410 is turned on.

In one configuration, the backside field plate 430 is positioned for directing movement of charge to a backside interface between the backside field plate 430 and the insulator layer 420. For example, the backside field plate 430 may be positively biased for adjusting an electric field in the drift region 412 of the active device 410. That is, the backside field plate 430 may control internal electron distribution by adjusting the bias in the backside field plate 430. Controlling the charge movement reduces exposure of the gate oxide to hot carrier injection, which prevents gate oxide damage. If the backside field plate is biased separately from other electrodes, higher voltages can be used for enhancing desired effects. These desired effects may include a lower on-resistance as well as a higher off-breakdown voltage.

In a different configuration, the backside field plate 430 may be connected to the gate 402 or the source region of the active device 410. Alternatively, the backside field plate 430 may be separately biased. In addition, the backside field plate 430 may be used effectively on N-type or P-type field effect transistors (FETs). Placement of a left edge of the backside field plate 430 to overlap the gate 402 may be selectively varied for improving an on-resistance and/or reducing parasitic capacitance. Placing the right edge of the backside field plate 430 toward a drain side may also be selectively varied for improving the breakdown voltage and/or reducing the parasitic capacitance. The length of the drift region 412 may also be varied. The doping concentration in the drift region 412 may be varied. The gate length may also be varied. A semiconductor (e.g., silicon) layer thickness may also be varied. A body tie for removing excess charge from the body may be beneficial for operating the active device 410. A backside oxide thickness, a gate oxide thickness, and/or a channel doping may also be varied.

According to aspects of the present disclosure, layer transfer technology is used for forming a backside field plate (BFP). As described, the term "field plate" is used, but the backside electrode could be connected to the gate, source, or biased independently of both. If a backside field plate is connected to the gate, it is essentially acting as a field plate, but with considerably reduced gate-to-drain capacitance because it is not in proximity to the drain metal.

Figure 4B:
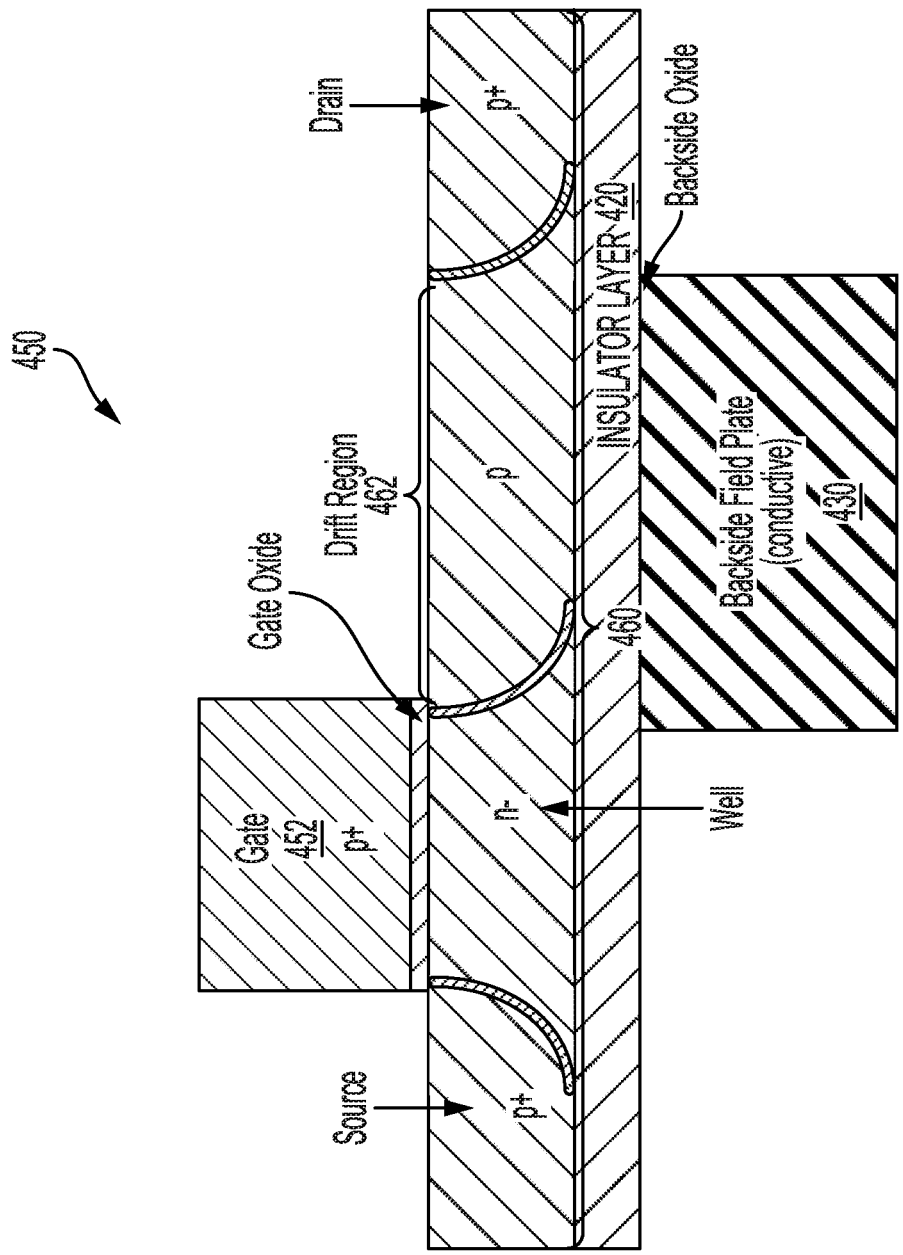
FIG. 4B is a cross-sectional view of a P-type semiconductor device on a semiconductor on insulator (SOI) layer with a backside field plate fabricated using a layer transfer process, according to aspects of the present disclosure.

FIG. 4B is a cross-sectional view of a P-type semiconductor device on a semiconductor on insulator (SOI) layer with a backside field plate fabricated using a layer transfer process, according to aspects of the present disclosure. In this configuration, an RF integrated circuit 450 includes an active device 460 formed on an insulator layer 420. The active device 460 includes a gate 452, a well, a gate oxide between the well and the gate 452, a source region, and a drain region formed on the insulator layer 420. In this configuration, the active device 460 is also an LDMOS transistor, as noted by a drift region 462 between the well and the drain of the active device 460. In contrast to the configuration shown in FIG. 4A, the doping of the regions of the active device 460 and the gate 452 are switched to an opposite polarity to form the active device 460 as a P-type LDMOS field effect transistor (FET).

Figure 5A:
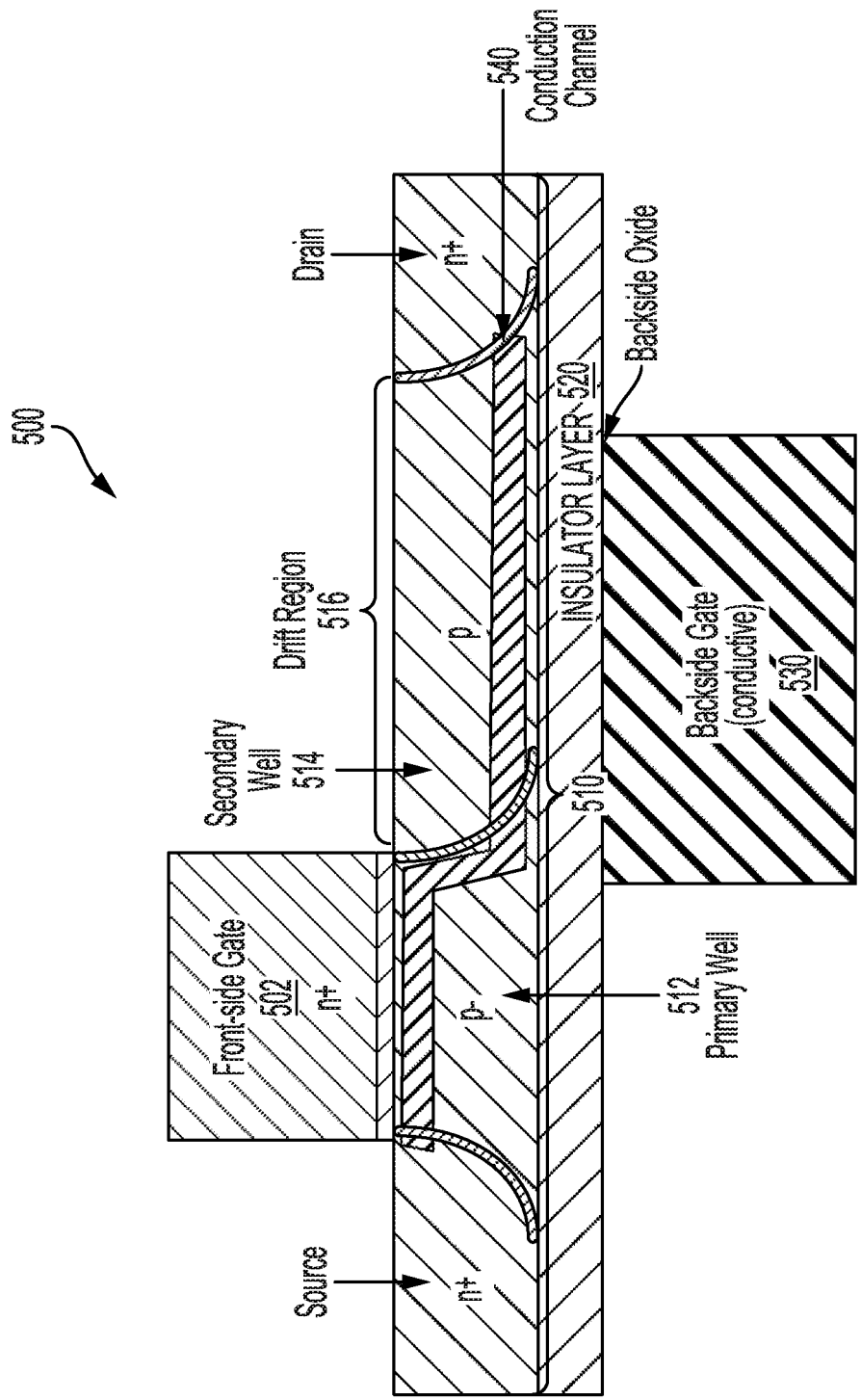
FIG. 5A is a cross-sectional view of an N-type semiconductor device on a semiconductor on insulator (SOI) layer with a backside gate fabricated using a layer transfer process, according to aspects of the present disclosure.

FIG. 5A is a cross-sectional view of an N-type semiconductor device on a semiconductor on insulator (SOI) layer with a backside gate fabricated using a layer transfer process, according to aspects of the present disclosure. In this configuration, an RF integrated circuit 500 includes an active device 510 formed on an insulator layer 520. The active device 510 includes a front-side gate 502, a primary well 512, a gate oxide between the primary well 512 and the front-side gate 502, a source region, and a drain region formed on the insulator layer 520. In contrast to the configuration shown in FIG. 4A, the doping of a drift region 516 is switched to an opposite polarity to form a PN junction between a secondary well 514 and the drain. The PN junction causes a conduction channel 540 to form during operation of the RF integrated circuit 500. The conduction channel 540 may be controlled by varying a size and/or a position of a backside gate 530.

Figure 5B:
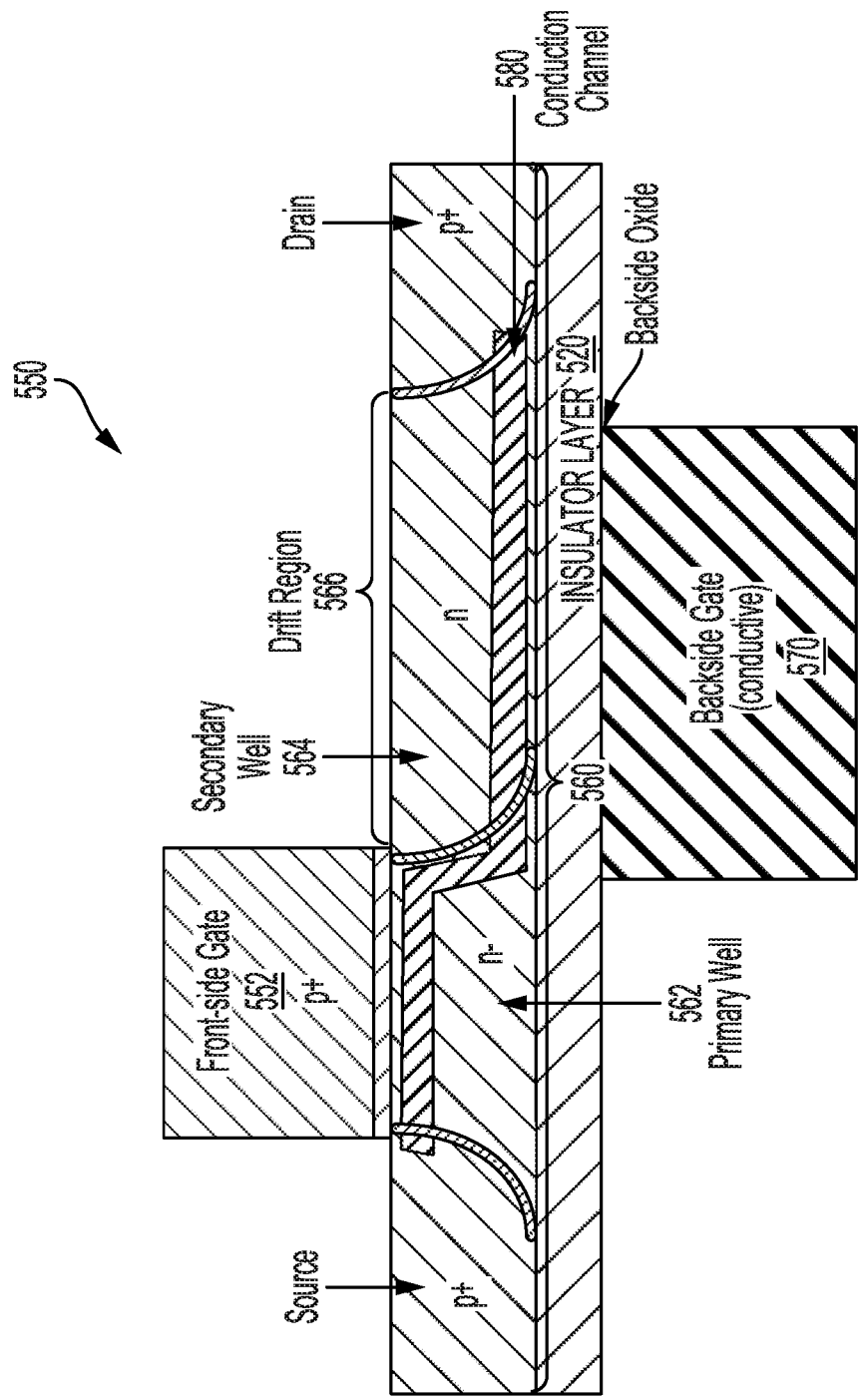
FIG. 5B is a cross-sectional view of a P-type semiconductor device on a semiconductor on insulator (SOI) layer with a backside gate fabricated using a layer transfer process, according to aspects of the present disclosure.

FIG. 5B is a cross-sectional view of a P-type semiconductor device on a semiconductor on insulator (SOI) layer with a backside gate fabricated using a layer transfer process, according to aspects of the present disclosure. In this configuration, an RF integrated circuit 550 includes an active device 560 formed on an insulator layer 520. The active device 560 includes a front-side gate 552, a primary well 562, a gate oxide between the primary well 562 and the front-side gate 552, a source region, and a drain region formed on the insulator layer 520.

In contrast to the configuration shown in FIG. 5A, the doping of the regions of the active device 560 and the front-side gate 552 are switched to an opposite polarity. This polarity switch forms the active device 560 as a P-type LDMOS field effect transistor (FET) having a backside gate 570. In contrast to the configuration shown in FIG. 5A, the doping of the drift region 566 is switched to an opposite polarity to form a PN junction between the drain and a secondary well 564. The PN junction causes a conduction channel 580 to form during operation of the RF integrated circuit 550. In this configuration, the conduction channel 580 may be controlled by varying a size and/or a position of the backside gate 570.

According to this aspect of the present disclosure, a doping of the drift region (e.g., 412, 462, 516, 566) of the LDMOS device (e.g., 410, 460, 510, 560) may be changed to an opposite polarity. For example, for an N-type LDMOS device (e.g., 410, 510), a doping of the drift region (e.g., 412, 516) is changed to an opposite polarity from N-type to P-type, for example, as shown in FIGS. 4B and 5B. Similarly, for a P-type LDMOS device (e.g., 460, 560), a doping of the drift region (e.g., 462, 566) is changed to an opposite polarity from P-type to N-type. This change in polarity forms a secondary well (e.g., 514, 564) as the drift region (e.g., 516, 566). Changing the doping of the drift region (e.g., 516, 566) forms a PN junction between a secondary well (e.g., 514, 564) and a drain region of the LDMOS (e.g., 510, 560).

In this configuration, the drift region forms a secondary well of the LDMOS device. In addition, the backside device of the LDMOS device operates as a backside gate, controlling a conduction channel (e.g., 540, 580) in the secondary well (e.g., 514,564). A front-side gate (e.g. 502, 552) controls a conductor channel in the primary well (e.g., 512, 564).

Figure 6:
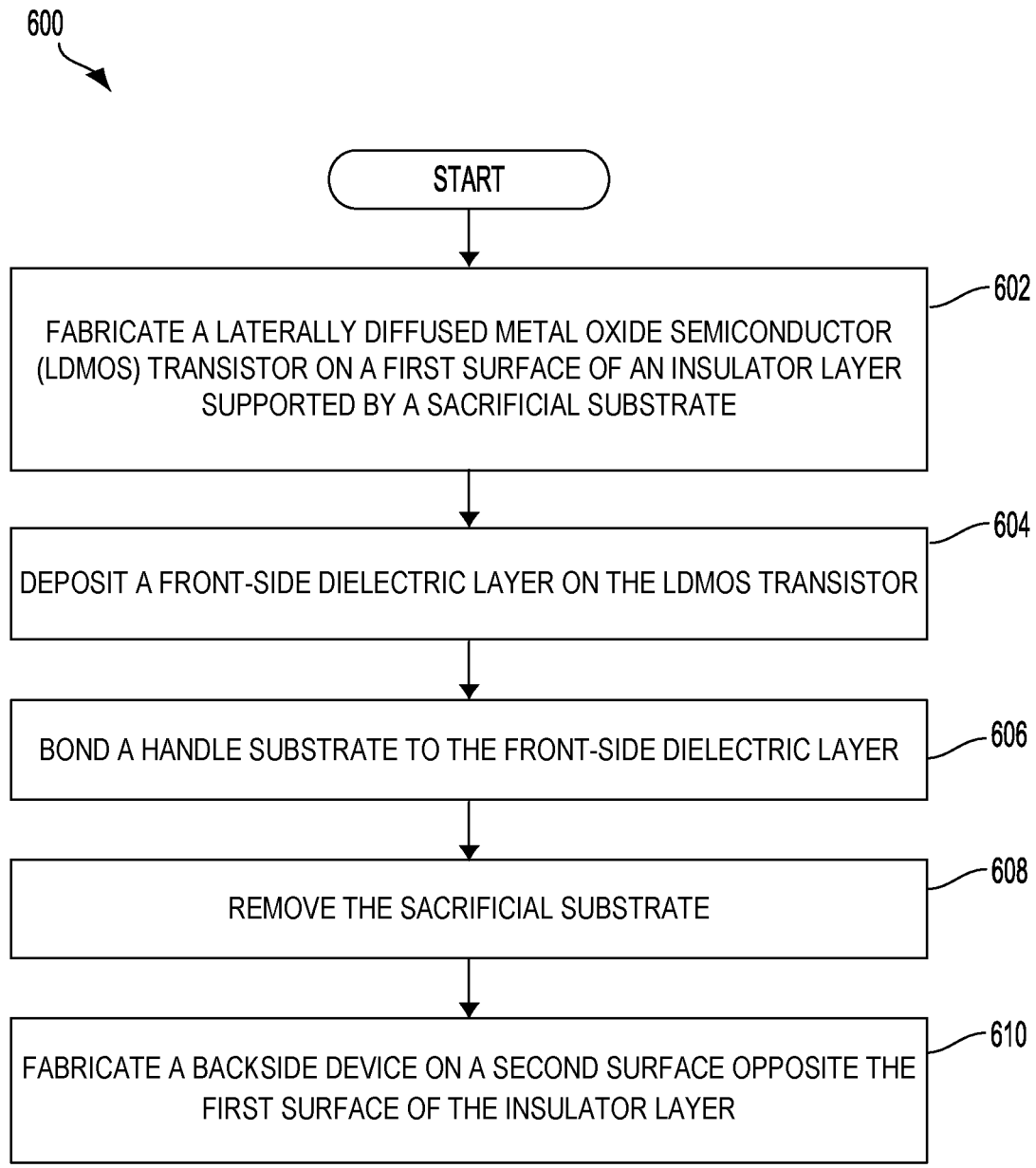
FIG. 6 is a process flow diagram illustrating a method of fabricating a semiconductor device on a semiconductor on insulator (SOI) layer with a backside device, according to an aspect of the present disclosure.

FIG. 6 is a process flow diagram illustrating a method of constructing an integrated circuit having a backside field plate using a layer transfer process according to an aspect of the present disclosure. The method 600 begins at block 602, in which a laterally diffused metal oxide semiconductor (LDMOS) transistor is fabricated on a first surface of an insulator layer. The insulator layer is supported by a sacrificial substrate. For example, as shown in FIG. 2A, an active device 210 is fabricated on a buried oxide (BOX) layer 220. In block 604, a front-side dielectric layer is deposited on the LDMOS transistor. For example, as shown in FIG. 3, the front-side dielectric layer 306 is deposited on the active device 310.

Referring again to FIG. 6, in block 606, a handle substrate is bonded to the front-side dielectric layer. For example, as shown in FIG. 3, a handle substrate 302 is bonded to the front-side dielectric layer 304. In block 608 of FIG. 6, the sacrificial substrate is removed. As shown in FIG. 2B, the layer-transfer process includes removal of the sacrificial substrate 201. In block 610, a backside device is fabricated on a second surface opposite the first surface of the insulator layer. For example, as shown in FIG. 4A, a conductive material (e.g., copper) is deposited on the second surface of the insulator layer 420 to form the backside field plate 430. In this example, the backside field plate 430 is formed to at least partially overlap with the gate 402 and the drift region 412 between the gate 402 and a drain region of the LDMOS transistor. In alternative configurations shown in FIGS. 5A and 5B, a backside gate (e.g., 530/570) is provided in place of the backside field plate 430.

Aspects of the present disclosure describe a backside device (e.g., a backside field plate) to reduce hot carrier injection in an LDMOS transistor. One aspect of the present disclosure uses a backside metallization process with layer transfer to form the backside field plate on a second surface opposite a first surface of an insulator layer. Biasing of the backside field plate is adjusted to control an internal electron distribution within a drift region between a gate and a drain region of the LDMOS transistor. In some cases, the front-side will be referred to as the first-side. In other cases, the backside will be referred to as the first-side. It is contemplated that the LDMOS could be incorporated in RF power amplifiers as well as RF switches.

In different configurations, a backside device is connected to a gate or a source region of the LDMOS device. Alternatively, the backside device may be separately biased. In addition, the backside device may be used effectively on N-type or P-type field effect transistors (FETs). Placement of an edge of the backside device on a gate side may be selectively varied for improving an on-resistance and/or reducing parasitic capacitance. A location of the edge of the backside device on a drain side may also be selectively varied for improving the breakdown voltage and/or reducing the parasitic capacitance. The length of the drift region may also be varied. The doping concentration in the drift region may be varied. The gate length may also be varied. A semiconductor (e.g., silicon) layer thickness may also be varied. A body tie for removing excess charge from the body may be beneficial to operating the LDMOS device. A backside oxide thickness, a gate oxide thickness, and/or a channel doping may also be varied. The variations of the backside device may be adjusted to control a conduction channel of the LDMOS device.

According to a further aspect of the present disclosure, an integrated circuit includes an LDMOS transistor on a first surface of an insulator layer. The integrated circuit includes a means for biasing a secondary well between a drain region and a gate of the LDMOS transistor. The biasing means may be the backside field plate 430, shown in FIGS. 4A and 4B. In another aspect, the aforementioned means may be any layer, module, or any apparatus configured to perform the functions recited by the aforementioned means.

Figure 7:
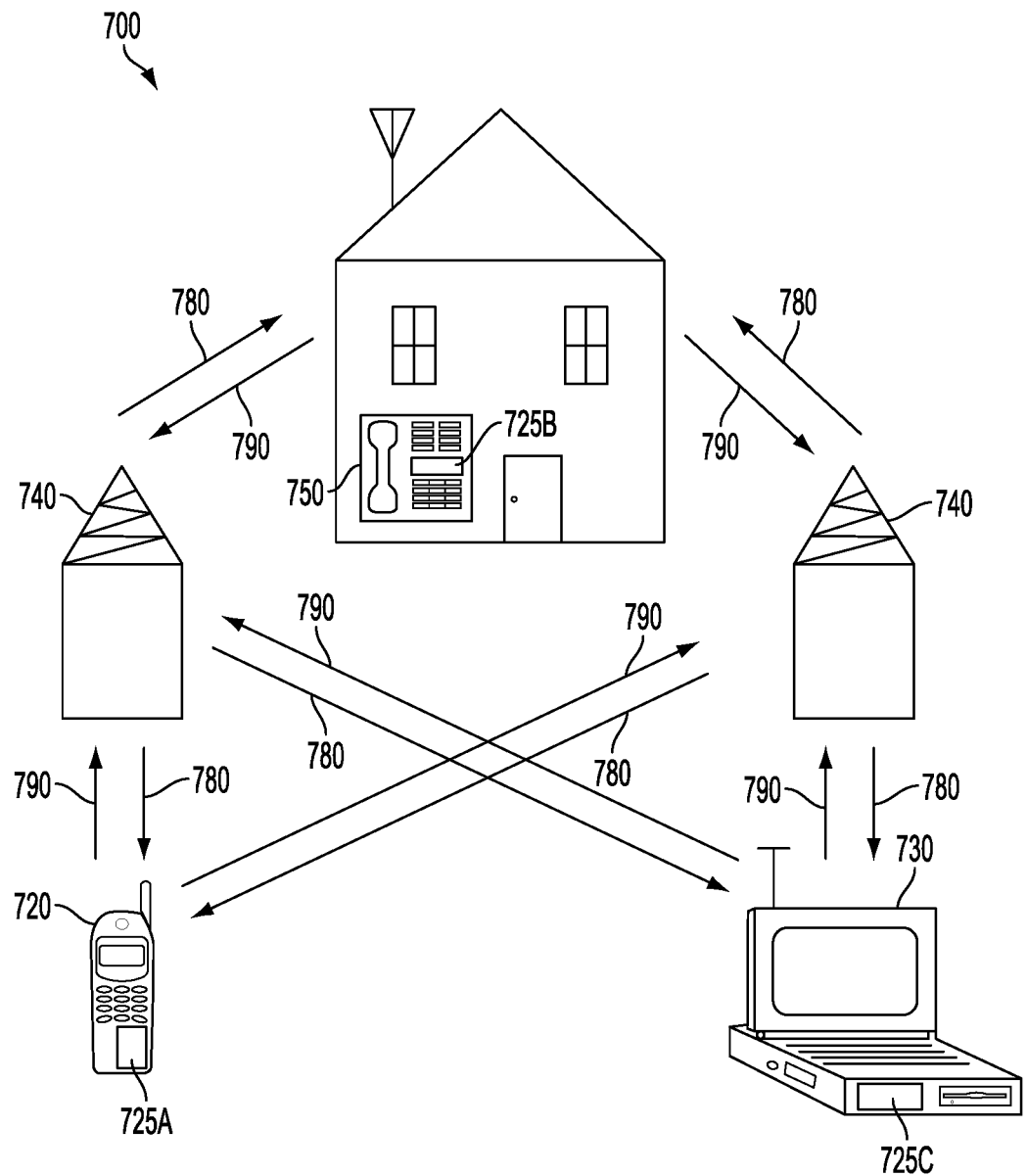
FIG. 7 is a block diagram showing an exemplary wireless communications system in which an aspect of the present disclosure may be advantageously employed.

FIG. 7 is a block diagram showing an exemplary wireless communications system 700 in which an aspect of the present disclosure may be advantageously employed. For purposes of illustration, FIG. 7 shows three remote units 720, 730, and 750 and two base stations 740. It will be recognized that wireless communications systems may have many more remote units and base stations. Remote units 720, 730, and 750 include IC devices 725A, 725C, and 725B that include the disclosed LDMOS transistor. It will be recognized that other devices may also include the disclosed LDMOS transistor, such as the base stations, switching devices, and network equipment. FIG. 7 shows forward link signals 780 from the base station 740 to the remote units 720, 730, and 750, and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, a remote unit may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as meter reading equipment, or other communications device that stores or retrieves data or computer instructions, or combinations thereof. Although FIG. 7 illustrates remote units according to the aspects of the present disclosure, the present disclosure is not limited to these exemplary illustrated units. Aspects of the present disclosure may be suitably employed in many devices, which include the disclosed LDMOS transistor.

Figure 8:
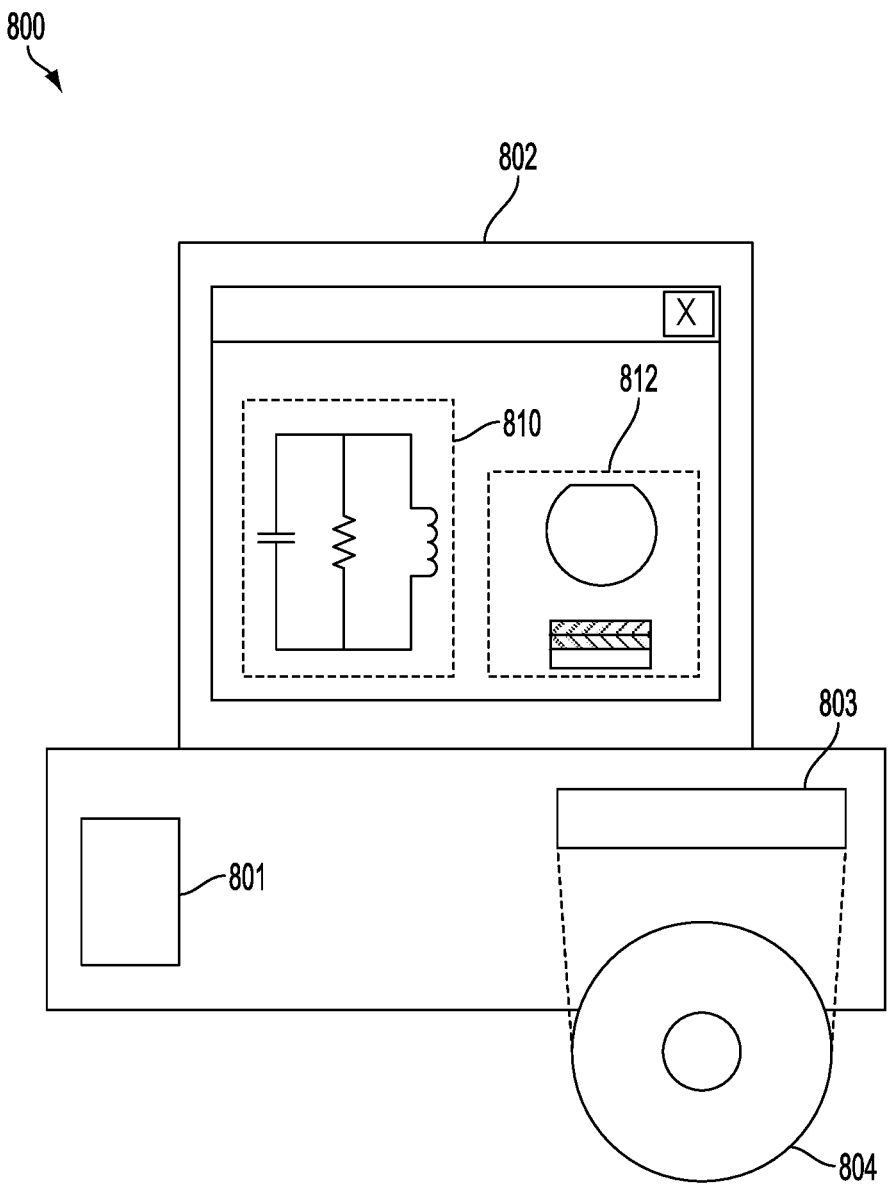
FIG. 8 is a block diagram illustrating a design workstation used for circuit, layout, and logic design of a semiconductor component, such as the RF devices disclosed above.

FIG. 8 is a block diagram illustrating a design workstation used for circuit, layout, and logic design of a semiconductor component, such as the LDMOS transistor disclosed above. A design workstation 800 includes a hard disk 801 containing operating system software, support files, and design software such as Cadence or OrCAD. The design workstation 800 also includes a display 802 to facilitate a circuit design 810 or an IC 812 having an LDMOS transistor. A storage medium 804 is provided for tangibly storing the circuit design 810 or the IC 812 including the LDMOS transistor. The circuit design 810 or the IC 812 including the LDMOS transistor may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the IC 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to

What is claimed is:

1. An integrated circuit, comprising:
   a laterally diffused metal oxide semiconductor (LDMOS) transistor on a first surface of an insulator layer, the LDMOS transistor including a source region, a drain region, a gate, and a secondary well between the drain region and the gate, the secondary well having an opposite polarity from the drain region; and
   a backside device on a second surface opposite the first surface of the insulator layer, the backside device extending through a proximate plane of a proximate edge of the gate, the proximate edge being nearest to the secondary well, but not extending through a distal plane of a distal edge of the gate furthest away from the secondary well.

2. The integrated circuit of claim 1, in which the backside device comprises a backside field plate partially overlapping with the gate of the LDMOS transistor.

3. The integrated circuit of claim 1, in which a length of the backside device is in a range of 0.5 to 1.5 microns, and a thickness of the backside device is approximately 270 nanometers.

4. The integrated circuit of claim 1, in which the LDMOS transistor is a component of a high voltage power amplifier.

5. The integrated circuit of claim 1, in which the LDMOS transistor is a component of a high voltage switch.

6. The integrated circuit of claim 1, in which the backside device comprises a backside gate.

7. The integrated circuit of claim 1, integrated into an RF front-end module, the RF front-end module incorporated into at least one of a music player, a video player, an entertainment unit, a navigation device, a communications device, a personal digital assistant (PDA), a fixed location data unit, a mobile phone, and a portable computer.

8. An integrated circuit, comprising:
   a laterally diffused metal oxide semiconductor (LDMOS) transistor on a first surface of an insulator layer, the LDMOS transistor including a source region, a drain region, a gate, and a secondary well between the drain region and the gate, the secondary well having an opposite polarity from the drain region; and
   means for biasing a backside of the secondary well of the LDMOS transistor, the means for biasing extending through a proximate plane of a proximate edge of the gate, the proximate edge being nearest to the secondary well, but not extending through a distal plane of a distal edge of the gate furthest away from the secondary well.

9. The integrated circuit of claim 8, in which the LDMOS transistor is a component of a high voltage power amplifier.

10. The integrated circuit of claim 8, in which the LDMOS transistor is a component of a high voltage switch.

11. The integrated circuit of claim 8, in which the means for biasing is arranged to partially overlap with the gate of the LDMOS transistor.

12. The integrated circuit of claim 8, integrated into a radio frequency (RF) front-end module, the RF front-end module incorporated into at least one of a music player, a video player, an entertainment unit, a navigation device, a communications device, a personal digital assistant (PDA), a fixed location data unit, a mobile phone, and a portable computer.

* * * * *